(12) United States Patent
Furusawa et al.

(10) Patent No.: US 7,285,305 B2
(45) Date of Patent: Oct. 23, 2007

(54) MULTILAYERED WIRING BOARD, METHOD OF PRODUCING MULTILAYERED WIRING BOARD, ELECTRONIC DEVICE AND ELECTRONIC APPARATUS

(75) Inventors: Masahiro Furusawa, Chino (JP); Hirofumi Kurosawa, Tatsuno-machi (JP); Takashi Hashimoto, Chino (JP); Masaya Ishida, Hara-mura (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/417,398

(22) Filed: Apr. 16, 2003

(65) Prior Publication Data

US 2004/0000429 A1    Jan. 1, 2004

(30) Foreign Application Priority Data

Apr. 16, 2002    (JP) ............................. 2002-113621

(51) Int. Cl.
*B05D 5/12* (2006.01)
*B05D 3/02* (2006.01)

(52) U.S. Cl. .................... 427/117; 427/97.1; 427/97.3; 427/98.4; 427/123; 427/265; 427/383.1

(58) Field of Classification Search .............. 427/96, 427/117, 123, 256, 286, 372.2, 97.1, 97.3, 427/98.4, 261, 265, 282; 101/129
See application file for complete search history.

(56) References Cited

U.S. PATENT DOCUMENTS

| | | | |
|---|---|---|---|
| 4,668,533 A * | 5/1987 | Miller ......................... | 427/98 |
| 4,791,239 A | 12/1988 | Shirahata et al. | |
| 5,082,718 A | 1/1992 | Chantraine et al. | |
| 5,124,781 A * | 6/1992 | Tashiro ....................... | 257/759 |
| 5,200,026 A | 4/1993 | Okabe | |
| 5,594,652 A | 1/1997 | Penn et al. | |
| 5,650,199 A | 7/1997 | Chang et al. | |
| 5,948,533 A | 9/1999 | Gallagher et al. | |
| 6,010,769 A * | 1/2000 | Sasaoka et al. ............. | 428/209 |
| 6,261,941 B1 * | 7/2001 | Li et al. ..................... | 438/618 |
| 6,487,774 B1 * | 12/2002 | Nakao et al. .............. | 29/890.1 |
| 6,503,831 B2 * | 1/2003 | Speakman .................. | 438/674 |
| 6,707,153 B2 | 3/2004 | Kuwabara et al. | |
| 6,753,033 B2 | 6/2004 | Hashimoto et al. | |
| 7,202,155 B2 * | 4/2007 | Fukuchi ..................... | 438/622 |

(Continued)

FOREIGN PATENT DOCUMENTS

JP    07-040445    2/1995

(Continued)

OTHER PUBLICATIONS

Communication from Japanese Patent Office regarding related application.

*Primary Examiner*—Brian K. Talbot
(74) *Attorney, Agent, or Firm*—Harness, Dickey & Pierce, P.L.C.

(57) ABSTRACT

A method of producing a multilayered wiring board having at least two wiring layers (wiring patterns 17, 31), polyamide 22 (an interlayer insulation film) between the wiring layers, and an interlayer conducting post (a conductor post) 18 for conducting between the wiring pattern 17 and the wiring pattern 31, wherein the polyimide 22 is disposed around the interlayer conducting post 18 using a liquid drop discharge system.

6 Claims, 9 Drawing Sheets

U.S. PATENT DOCUMENTS

| | | |
|---|---|---|
| 2001/0029665 A1 | 10/2001 | Hashimoto et al. |
| 2002/0008320 A1 | 1/2002 | Kuwabara et al. |
| 2003/0185971 A1* | 10/2003 | Saksa et al. .................. 427/96 |
| 2004/0145858 A1* | 7/2004 | Sakurada .................... 361/600 |

FOREIGN PATENT DOCUMENTS

| | | |
|---|---|---|
| JP | 07-231154 | 8/1995 |
| JP | 10-326559 | 12/1998 |
| JP | 11-054928 | 2/1999 |
| JP | 11-163499 | 6/1999 |
| JP | 11-274671 | 10/1999 |
| JP | 11-274681 | 10/1999 |
| JP | 2000-294930 | 10/2000 |
| JP | 2001-267308 | 9/2001 |
| JP | 2001-267725 | 9/2001 |
| WO | WO 01/71805 A1 | 9/2001 |

* cited by examiner

MULTILAYERED WIRING BOARD, METHOD OF PRODUCING MULTILAYERED WIRING BOARD, ELECTRONIC DEVICE AND ELECTRONIC APPARATUS

TECHNICAL FIELD OF THE INVENTION

The present invention relates to a multilayered wiring board, a method of producing the multilayered wiring board, an electronic device and an electronic apparatus.

DESCRIPTION OF THE RELATED ART

Multilayered printed wiring boards are conventionally produced as follows: Firstly, respective layers are aligned with and laminated on a monolayer board on which a pattern is formed by etching. Then, through-holes are provided on the predetermined positions of the board to electrically connect above and below wiring layers. Plating is made on surroundings of the through-holes for connection or the through-holes are filled with a conductive paste, whereby the multilayered printed wiring board is formed.

However, by the above production method, pads for mounting parts cannot be formed on the through-holes, and it is difficult to use it for high density packaging since each through-hole has generally a diameter of about 0.3 mm.

In recent years, there is used a method of electrically connecting the interlayers by non-through interlayer connection (Interstitial Via Hole, hereinafter referred to as "IVH") in order to improve surface mounting density. Using such a method, the holes on an insulation layer are filled with the conductive paste, or the non-through holes disposed on the insulation layer is metal plated with a photosensitive resin. Thus, resin multilayered printed wiring boards that all layers can be connected by the IVH are practically used.

However, any conventional methods adopt the technique that the insulation film is perforated and the holes are plated or filled with the conductive paste. Thus, the production processes becomes complex.

Japanese Examined Patent Application Publication No. 6-57455 discloses a method of forming a multilayered wiring by forming conductive posts for connecting layers on a bottom wiring layer using photolithography, applying a resin around the conductive posts to form an insulation film by a hot press so that the top surfaces of the conductive posts are exposed, and then forming a top wiring layer, without perforating the insulation layer.

Japanese Unexamined Patent Application Publication No. 9-46045 discloses a method of forming the conductive posts for connecting the interlayers by depositing stud bumps, conductive balls or metal particulates.

However, in the methods disclosed in the above-mentioned publications, the bottom wiring layer and the conductive posts for connecting the interlayers are formed separately by different processes. Thus, the production processes becomes complex. Also, in the methods disclosed in the above-mentioned publications, top surfaces of the conductive posts are exposed by a hot press after the insulation film is coated over the whole surface. Thus, heights of the conductive posts are required to be completely the same.

Japanese Unexamined Patent Application Publication No. 2000-204479 discloses a method of forming an insulation film selectively by etching a desired pattern using an insulation solution and by heating and drying it, without perforating the insulation layer. Japanese Unexamined Patent Application Publication No. 2000-204479 discloses a method of forming a conductive wiring pattern selectively by applying an activator for electroless plating such as a silane coupling agent using a liquid drop discharge system (ink jet method) and then plating.

As described above, the pattern is applied so that the insulation layer and the conductive layer are formed at the predetermined order, whereby a three-dimensional wiring structure can be formed.

However, in the above-mentioned conventional techniques, it is difficult to form an -elaborate pattern in which widths of line/space are 20 µm/20 µm, because the plating is made. Also, it is needed to treat waste solutions.

An object of the present invention is to provide a multilayered wiring board, a method of producing the multilayered wiring board, an electronic device and an electronic apparatus in which elaborate multilayered wiring can be formed with relatively simple production processes.

SUMMARY OF THE INVENTION

In order to achieve the aforementioned object, according to the present invention, there is provided a method of producing a multilayered wiring board having at least two wiring layers, an interlayer insulation film between the wiring layers, and a conductor post for conducting between the wiring layers, wherein the interlayer insulation film is disposed around the conductor post using a liquid drop discharge system.

According to such a method, photolithography, etching and perforation processes are not needed for forming the interlayer insulation film, whereby simplifying the steps of producing the multilayered wiring board. The production apparatus can be small-sized, the production time can be shortened and the production costs can be decreased.

In addition, the interlayer insulation film can be formed without requiring a mask. The interlayer insulation film can be formed directly from a CAD data, whereby the time from a design to a completion can be shortened and a design change can be easily made.

Furthermore, the interlayer insulation film is formed by the liquid drop discharge system, whereby the interlayer insulation film can be formed after top surfaces of the conductor posts are exposed with certainty.

In the method of producing a multilayered wiring board according to the present invention, the interlayer insulation film is preferably formed using a liquid with a low viscosity.

According to such a method, the top surfaces of the conductor posts formed on an underlayer wiring are aligned with a top surface of the interlayer insulation film by a self-leveling effect, even if the underlayer has difference in level more or less. Thus, the multilayered wiring board with an excellent structure can be formed.

In the method of producing a multilayered wiring board according to the present invention, the conductor post is preferably formed by a liquid drop discharge system.

According to such a method, photolithography, etching and perforation processes are not needed for forming the interlayer insulation film, whereby simplifying the steps of producing the multilayered wiring board. The production apparatus can be small-sized, the production time can be shortened and the production costs can be decreased.

In addition, the interlayer insulation film can be formed without requiring a mask. The interlayer insulation film can be formed directly from a CAD data, whereby the time from a design to a completion can be shortened and a design change can be easily made.

In the method of producing a multilayered wiring board according to the present invention, at least one of the wiring layers is preferably formed by a liquid drop discharge system.

According to such a method, photolithography, etching and perforation processes are not needed for forming the interlayer insulation film, whereby simplifying the steps of producing the multilayered wiring board. The production apparatus can be small-sized, the production time can be shortened and the production costs can be decreased.

In addition, the interlayer insulation film can be formed without requiring a mask. The interlayer insulation film can be formed directly from a CAD data, whereby the time from a design to a completion can be shortened and a design change can be easily made.

In the method of producing a multilayered wiring board according to the present invention, all of the interlayer insulation film, the wiring layers and the conductor post are preferably formed by a liquid drop discharge system.

According to such a method, photolithography, etching and perforation processes are not needed for forming the interlayer insulation film, whereby simplifying the steps of producing the multilayered wiring board. The production apparatus can be small-sized, the production time can be shortened and the production costs can be decreased.

In addition, the interlayer insulation film can be formed without requiring a mask. The interlayer insulation film can be formed directly from a CAD data, whereby the time from a design to a completion can be shortened and a design change can be easily made.

In the method of producing a multilayered wiring board according to the present invention, all of the interlayer insulation film, the wiring layers and the conductor post are preferably formed using the same liquid drop discharge apparatus.

According to such a method, if the liquid drop discharge apparatus has a plurality of discharge heads, or if the head has a structure that a plurality of liquids (inks) are provided separately to a plurality of nozzle groups of one head like a normal color inkjet printer for printing images, the interlayer insulation film, the wiring layer and the conductor posts can be formed only by replacing an electronic file (bit maps) for controlling an application pattern. Consequently, the production time can be further shortened, the production costs can be further decreased and the design change can further be easily made.

Preferably, in the method of producing the multilayered wiring board, the wiring and the conductor posts are formed by repeating alternately a discharge of a conductive ink to a board and a drying of the conductive ink discharged.

According to such a method, by alternately repeating the discharge of the conductive ink to the board and the drying of the conductive ink discharged, the wiring or the conductive film of the conductor posts can be thickened gradually to the desired thickness and height.

In the method, the applied film has liquid repellency to the conductive ink containing metal particulates after the conductive ink (solution) containing the same metal particulates is dried. When the conductive ink is applied over the film, the ink is not spread, and the film can be thickened advantageously in a height direction. Utilizing the advantage, the conductive posts can be formed only on needed parts.

In the method of producing a multilayered wiring board according to the present invention, a discharged surface of the board is preferably subjected a water repellent treatment before a liquid drop is discharged onto the board by the liquid drop discharge system.

According to such a method, widths of the wiring can be made narrow, resulting in a finer wiring structure.

In the method of producing a multilayered wiring board according to the present invention, a receptor layer is preferably formed on a discharged surface of the board before the liquid drop is discharged onto the board by the liquid drop discharge system.

According to such a method, the wiring and the conductor posts can be easily formed at the predetermined positions.

In the method of producing a multilayered wiring board according to the present invention, the wiring and the conductor post are preferably formed by firing the conductive ink that is discharged onto the board and is dried.

According to such a method, electrical conductivity can be developed in the conductive ink discharged onto the board. In other words, since the electrical conductivity cannot be developed only by drying the conductive ink, and can be developed by firing.

The method of producing a multilayered wiring board according to present invention preferably comprises the step of firing the interlayer insulation comprising the steps of discharging a liquid containing polyimide or a polyimide precursor onto the board.

According to such a method, the interlayer insulation film can be formed, for example, by diluting the polyimide precursor with a solvent to have a viscosity capable of being discharged in liquid drops, discharging the liquid drops and firing at 300 Celsius degrees.

The method of producing a multilayered wiring board according to the present invention comprises the step of forming the interlayer insulation film comprising the step of firing the board after the liquid containing polyimide or polyimide precursor is discharged onto the board.

In the method of producing a multilayered wiring board according to the present invention, an amount of a liquid drop discharged by the liquid drop discharge system, a density of the liquid drop disposed and a time for scanning the discharge are preferably adjusted so that the interlayer insulation layer has substantially the same height as that of the conductor post.

According to such a method, the multilayered wiring board having an excellent structure in which the height (film thickness) of the interlayer insulation film and the height (film thickness) of each conductor post become substantially the same.

In addition, if the self-leveling effect is expected upon the pattern application by the liquid drop discharge system, a negative pattern of the bit maps used for forming the conductor posts can be used as it is (avoiding the conductive posts) to apply for forming the interlayer insulation film. On the other hand, if the self-leveling effect is not so expected, after the application for forming the interlayer insulation film is made until the interlayer insulation film has the same height as that of the underlayer wiring so as to avoid the underlayer wiring, the application is made similarly so as to avoid the underlayer wiring. Finally, calcination is made to complete the interlayer insulation film comprising the polyimide.

The method of producing a multilayered wiring board of the present invention comprises the steps of forming the interlayer insulation film and the conductor post so that the interlayer insulation layer has substantially the same height as that of the conductor post, and forming at least one of the wiring layer, the interlayer insulation layer and the conductor post on the interlayer insulation film or the conductor post using the method of producing the multilayered wiring board as described herein.

According to a such method, the multilayered wiring board can be formed with relatively simple production processes. In other words, for example, after top surfaces of the conductor posts are exposed and parts other than the top surfaces are overlaid with the interlayer insulation film having the same height as those of the top surfaces of the conductor posts, the water repellent treatment of the board, the wiring and the conductive posts formation by the liquid drop discharge system, the firing, the formation of the interlayer insulation film, the firing and the like are repeated at the predetermined times. In principle, the multilayered wiring having non-limiting layers can be formed.

The method of producing a multilayered wiring board of the present invention comprises the step of forming the multilayered wiring on a chip having an integrated circuit using the method of producing the multilayered wiring board as described herein.

According to such a method, the multilayered wiring can be formed directly on an IC (integrated circuit) chip by the liquid drop discharge.

According to the method of producing the multilayered wiring board of the present invention, the multilayered wiring can be formed on the board that is formed on the way by other production method different from the method of producing the multilayered wiring board of the present invention.

This method is suitable, for example, for double-sided board mounting. Specifically, a pattern is formed on an innermost layer of the board, or through-holes are perforated in advance and are filled with a metal paste and the like. Then, the conductor posts are formed using the method of the present invention. Thus, the double-sided mounted multilayered wiring board can be formed only by the liquid drop discharge system.

In the method of producing a multilayered wiring layer board of the present invention comprising at least two wiring layers, an interlayer insulation film disposed between the wiring layers, and a conductor post for conducting between the wiring layers, at least one of the wiring layer, the interlayer insulation layer and the conductor post is preferably produced by the method disclosed herein.

According to such a board, the wiring layer, the interlayer insulation film or the conductor posts can be formed using the liquid drop discharge system, whereby high density multilayered wiring can be formed with high accuracy.

The multilayered wiring board of the present invention comprises at least two wiring layers, an interlayer insulation film disposed between the wiring layers, and a conductor post for conducting between the wiring layers, wherein the conductor post has a shape like a bowl turned upside down with a thickness of 1 micrometer to 20 micrometer and a diameter of 10 micrometer to 200 micrometer.

According to such a board, the conductor posts are very small, and therefore high density multilayered wiring can be formed with high accuracy.

In the multilayered wiring board according to the present invention, the interlayer insulation layer has preferably substantially the same height as that of the conductor post.

According to such a board, the multilayered wiring board having numbers of layers can be easily formed.

In the multilayered wiring board according to the present invention, a top surface of the interlayer insulation film is preferably formed substantially flat.

According to such a board, the multilayered wiring board having numbers of layers can be easily formed.

The electronic device of the present invention has a wiring layer, an interlayer insulation film formed on the wiring layer, and a conductor post connected to wiring of the wiring layer and formed through the interlayer insulation film, wherein at least one of the wiring layer, the interlayer insulation layer and the conductor post is produced by the production method described herein.

According to such an electronic device, the multilayered wiring board having high density can be formed with high accuracy.

The electronic device wiring board of the present invention has a wiring layer, an interlayer insulation film formed on the wiring layer, and a conductor post connected to wiring of the wiring layer and formed through the interlayer insulation film, wherein the conductor post has a shape like a bowl turned upside down with a thickness of 1 micrometer to 20 micrometer and a diameter of 10 micrometer to 200 micrometer.

According to such an electronic device, the conductor posts are very small, and therefore a very small electronic device can be constructed to miniaturize an electronic apparatus.

In the electronic device according to the present invention, the interlayer insulation layer has preferably substantially the same height as that of the conductor post.

According to such an electronic device, the electronic device having numbers of layers can be formed with high accuracy to miniaturize an electronic apparatus.

In the electronic device according to the present invention, a top surface of the interlayer insulation film is preferably formed substantially flat.

According to such an electronic device, the electronic device having numbers of layers can be formed with high accuracy, which enables to miniaturize and elaborate an electronic apparatus.

The electronic apparatus of the present invention comprises the multilayered wiring board.

According to the present invention, the production costs can be decreased and the electronic apparatus can be small-sized, while the production time is shortened.

The electronic apparatus of the present invention comprises the electronic device.

According to the present invention, the production costs can be decreased and the electronic apparatus can be small-sized, while the production time is shortened.

DESCRIPTION OF THE PREFERRED EMBODIMENTS

Referring to figures, the method of producing the multilayered wiring board according to the present invention will be described below.

First Embodiment

Figure 1:
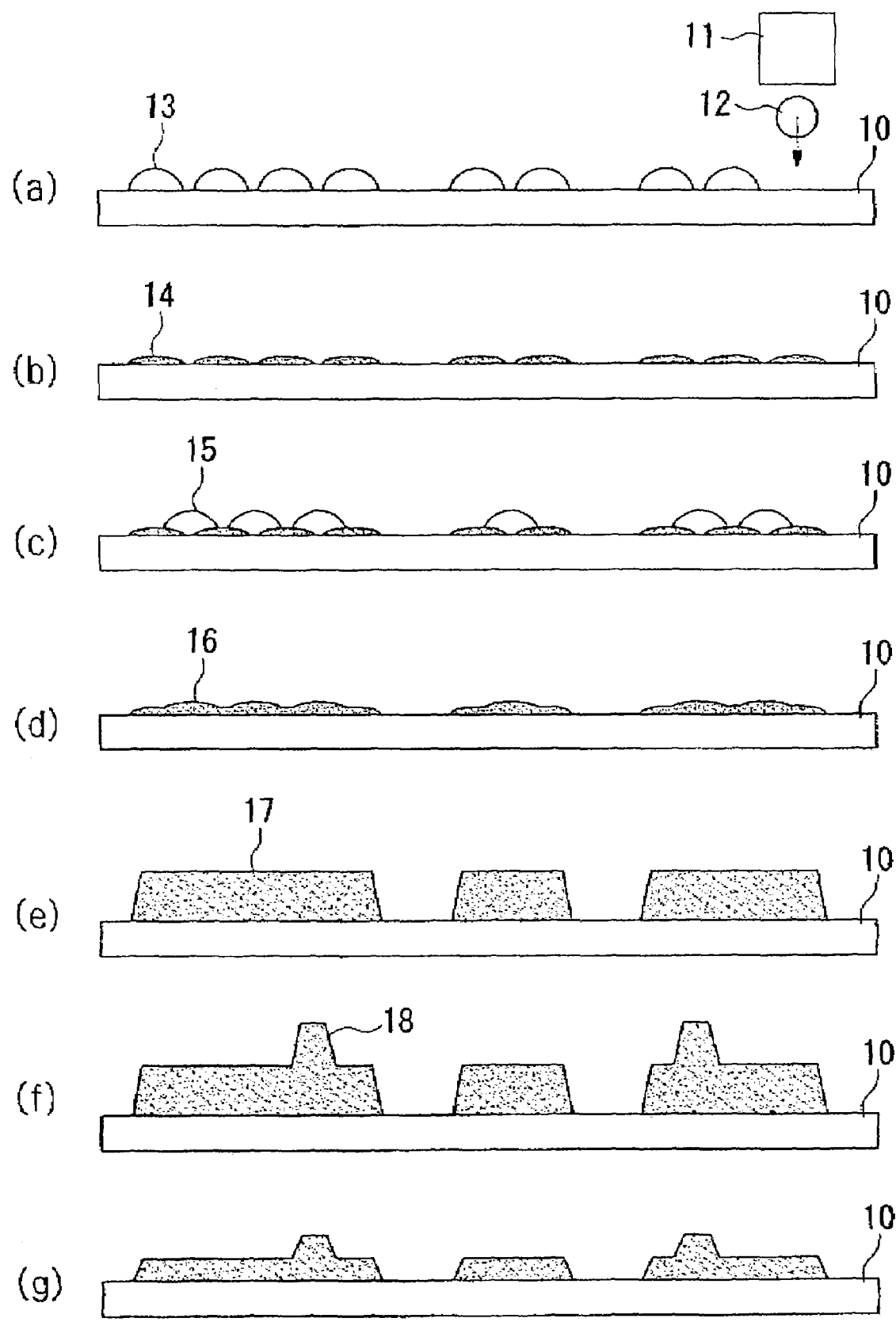
FIG. 1 is a process drawing showing the method of producing the multilayered wiring board according to a first embodiment of the present invention.
Figure 2:
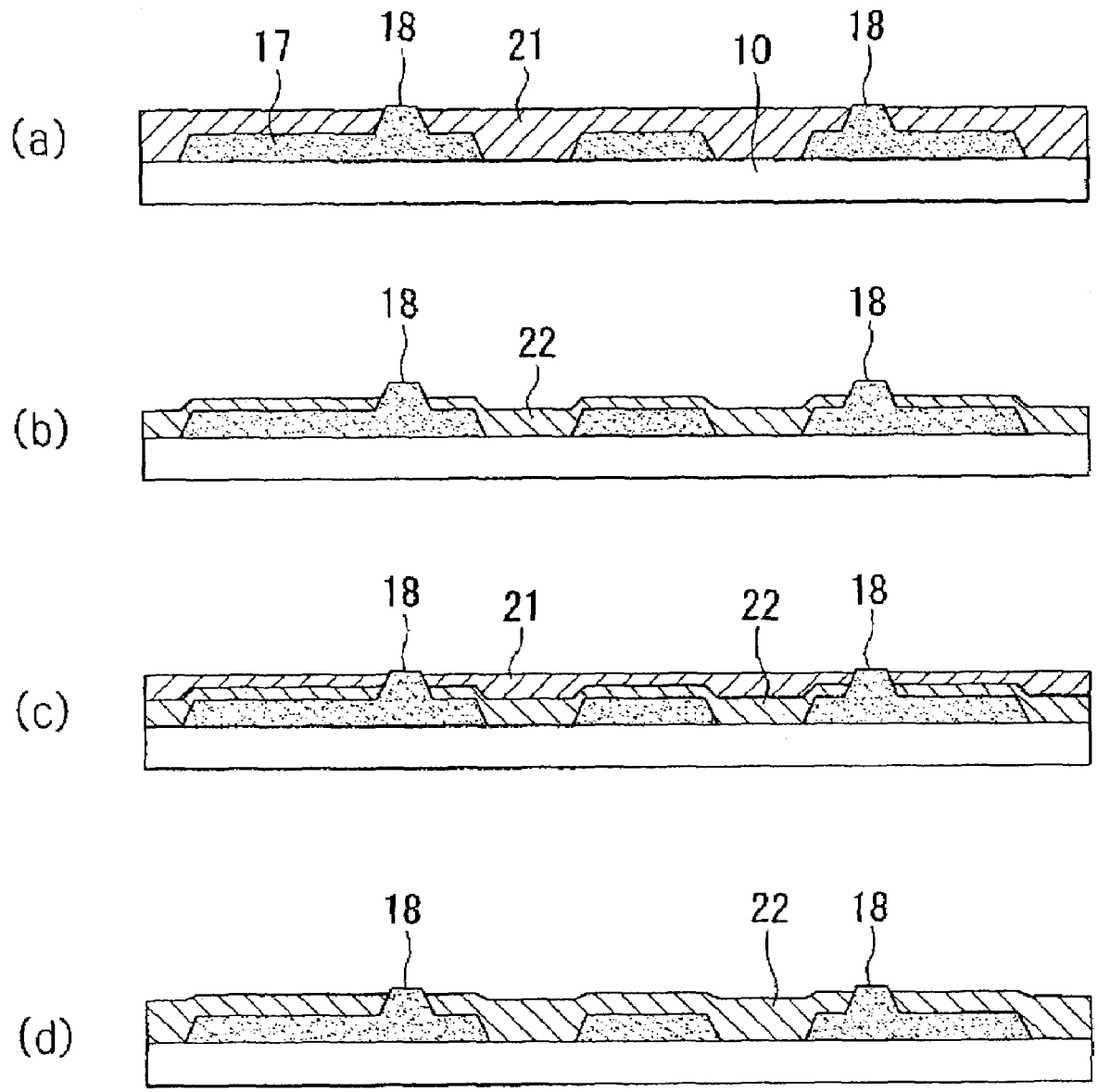
FIG. 2 is a process drawing showing the method of producing the multilayered wiring board according to a first embodiment of the present invention.
Figure 3:
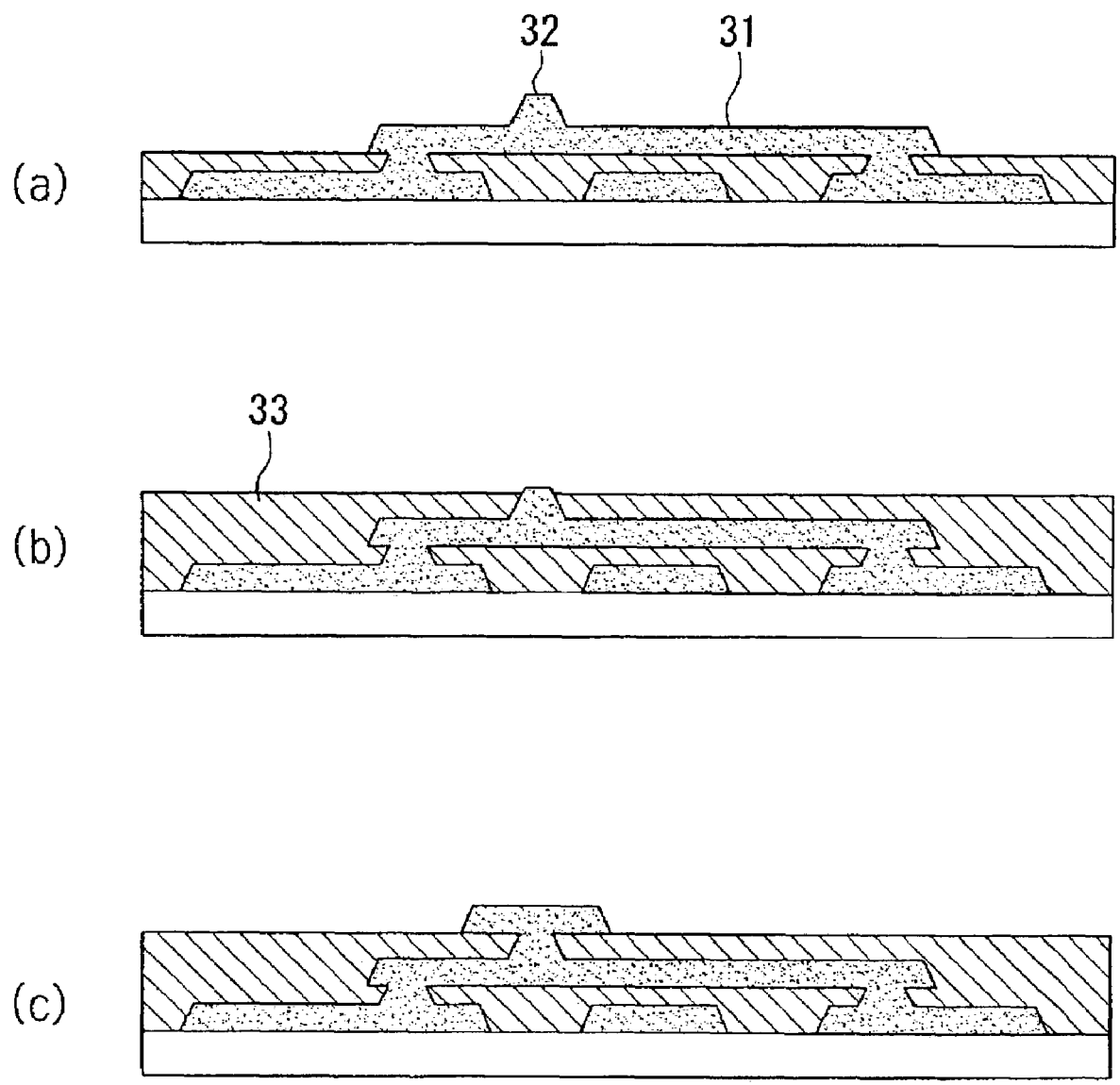
FIG. 3 is a process drawing showing the method of producing the multilayered wiring board according to a first embodiment of the present invention.

FIGS. 1 to 3 are process drawings showing the method of producing the multilayered wiring board according to one embodiment of the present invention. FIG. 1 shows processes from an ink repellent treatment process to an interlayer post formation process. FIG. 2 shows interlayer insulation film formation processes. FIG. 3 show processes after the second wiring pattern formation. In the present embodiment, a multilayered printed wiring is formed on one side of the board 10.

Conductive Ink

Firstly, there will be described a conductive ink that is a liquid discharged from a liquid drop discharge apparatus for use in the formation of the multilayered printed wiring. A gold particulate dispersion (made by Vacuum Metallurgical Co., Ltd. under the trade designation of "Perfect Gold") in which gold particulates having a diameter of about 10 nm are dispersed in toluene is diluted with toluene to have a viscosity of 3 [mPa·s]. The liquid is used as the conductive ink in this embodiment.

Ink Repellent Treatment Process

Then, an ink repellent treatment (water repellent treatment) provided to the surface of the board will be described. By the ink repellent treatment, a position of the conductive ink discharged onto the board can be controlled with high accuracy. The board 10 comprising polyimide is cleaned with IPA, irradiated with an ultraviolet ray with a wavelength of 254 nm at intensity of 10 mW/cm$^2$ for 10 minutes, and then cleaned (ultraviolet ray irradiation cleaning). To apply the ink repellent treatment to the board 10, 0.1 g of hexadecafuluoro 1,1,2,2 tetrahydrodecyl triethoxysilane and the board 10 are fed into a closed-container having a volume of 10 liter, and are held at 120 Celsius degree for 2 hours. An ink repellent monomolecular film is formed on the board 10. A contact angle between the surface of the board 10 on which the monomolecular film is formed and the conductive ink discharged thereon will be, for example, about 70 degrees.

Such contact angle between the surface of the board and the conductive ink after the ink repellent treatment is too large to form the multilayered printed wiring by the liquid drop discharge system. Accordingly, the board 10 is irradiated with the ultraviolet ray having the same wavelength (254 nm) used in the cleaning for 2 minutes. As a result, the contact angle between the conductive ink and the surface of the board becomes about 35°.

Alternatively, a receptor layer may be formed instead of the ink repellent treatment.

First Wiring Formation Process

The conductive ink is discharged onto the board 10 that is subjected to the ink repellent treatment. The ink is discharged from an ink jet head 11, of the liquid drop discharge apparatus as a liquid drop 12 to provide a bit map pattern having predetermined dot spaces. Then, a heat treatment is performed to form a conductive film pattern.

As the ink jet head 11, a head for commercially available printer (trade designation of "PM950C") is, for example, used. Since an ink inlet part is made of plastic, the ink inlet part is changed from plastic to metal jig so that the inlet part is not dissolved in an organic solvent. When the conductive ink is discharged with a driving voltage of 20 V of the ink jet head 11, the liquid drop having a volume of 5 pico liter is discharged. The diameter of the liquid drop 12 is about 27 µm. After the liquid drop 12 is fallen down to the board 10 (at the contact angle of 35 degree), the liquid drop 12 is broaden on the board 10 to have a diameter of about 45 µm.

A wiring pattern drawn on the board 10 is formed by designing white and black binary bit maps onto square grids having each side of 50 µm, and discharging the liquid drops 12 in accordance with the bit maps. As shown in FIG. 1(a), the conductive ink containing the gold particulates is discharged from the ink jet head 11 to the board 10 so that the ink is disposed per 50 µm.

Under the above conditions, one liquid drop 13 fallen onto the board 10 broadens with a diameter of about 45 µm, the liquid drop 13 is not contacted with other liquid drop 13, and all dots (liquid drops 13) are disposed separately on the board 10. After the pattern discharge is made, hot air at about 100 Celsius degrees is applied to the board about 10 for 15 seconds to dry the conductive ink. Then, the board 10 is self-cooled for several minutes until it returns back to room temperature, resulting in the state shown in FIG. 1(b).

After this treatment, the board 10 holds the same ink repellency as before. Ink liquid drops 14 are formed such that the solvent is dried from the liquid drops 13 and have a thickness of about 2 µm. The ink liquid drops 14 have substantially the same ink repellency as those of the parts on the board having no ink liquid drops 14.

As shown in FIG. 1(c), liquid drops 15 containing the same liquid as the liquid drops 13 are discharged between the separated dots (ink liquid drops 14) under the same conditions. FIG. 1 shows only a sectional view. But, when the isolated dots or the ink liquid drops 14 exist also in a vertical direction thereof, the liquid drops 15 are also discharged between the dots.

In this discharge, liquid repellencies of the board 10 and the ink liquid drops 14 are almost the same. Under the above conditions, almost the same results can be obtained as the case of the discharge onto the board 10 having no ink liquid drops 14.

The hot air is applied to the liquid drops 15 as described above to dry the solvent of the conductive ink. As a result, there is formed a pattern 16 where all ink liquid drops are connected as shown in FIG. 1(d).

In order to increase the film thickness and not to leave the dots in the wiring pattern, the discharge between the dots and the hot air drying are repeated 6 times in total including the above to form a wiring pattern 17 having a line width of 50 µm and a film thickness of 10 µm as shown in FIG. 1(e). In this stage, only the solvent of the conductive ink is dried and firing is not sufficient. Therefore, the wiring pattern has no electrical conductivity.

Interlayer Conductive Post Formation Process

Then, there is formed interlayer conductive posts (conductor posts) 18 for conducting with a second layer through an interlayer insulation film. The interlayer conductive posts can be formed by entirely the same processes as the first layer wiring formation processes as described above. In other words, the conductive ink containing silver particulates is discharged onto only places where interlayer conductivity is needed, is hot-air dried and is again discharged. The interlayer conductive posts 18 having a height of 10 μm from the first layer are formed by the discharges repeated 6 times in total as shown in FIG. 1(*f*).

The board 10 patterned is heat treated at 300 Celsius degrees in air for 30 minutes to electrically contact the silver particulates. The interlayer conductive posts 18 are formed integrally with the wiring patterns 17 of the first layer. By the heat treatment, a total thickness of the wiring patterns 17 and the interlayer conductive posts 18 becomes about half before the heat treatment as shown in FIG. 1(*g*). The silver wiring patterns have electrical conductivity of about 2 [μΩcm]. An adhesion between the wiring patterns 17 and the board 10 is evaluated by a Cellotape (registered trademark) test, resulting in sufficient adhesion without peeling. The conductor post 18 is, in this example, an inverted cone (having an upside down bowl shape) with a thickness of 1 micrometer to 20 micrometer and a diameter of 10 micrometer to 200 micrometer.

Interlayer Insulation Film Formation Process

Upon the formation of the interlayer insulation film, the board 10 on which the first layer wiring pattern 17 is formed is irradiated with an ultraviolet ray having a wavelength of 256 nm at intensity of 10 [mW/cm$^2$] for 5 minutes as a pretreatment. Inkphilicity is provided on the surface of the board 10 and the first wiring pattern.

As an ink 21 for forming the interlayer insulation film, commercially available polymeric resin such as polyimide varnish (made by Du Pont Corp. under the trade designation of "Pile ML") is, for example, diluted with a solvent (N-methyl-2-pyrolidone) to adjust its viscosity to 20 [mPa·s]. The ink 21 is applied to all portions excluding the interlayer conductive posts 18 using the same liquid drop discharge apparatus used in the formation of the conductive pattern in the aforementioned first layer wiring formation process. The amount of the ink liquid drops is, for example, 5 pico liter. The ink 21 falls down to and wets the surface of the inkphilic board 10 and the inkphilic wiring pattern 17. All portions excluding the interlayer conductive posts are covered with the ink 21. The surface of the ink 21 becomes flat by the self-leveling effect. As shown in FIG. 2(*a*), the ink 21 is re-applied several times by the liquid drop discharge apparatus so that the height of each interlayer conductive post 18 slightly protruded (about 0.1 μm) from the surface of the ink 21.

Then, the board 10 is heat-treated at 400 Celsius degree for 30 minutes to remove the solvent and to cure the polyimide. As a result, as shown in FIG. 2(*b*), the thickness of the polyimide 22 becomes about half of that of the ink 21 before the heat treatment.

The ink 21 is patterned and applied to the polyimide 22 as described above, so that each of interlayer conductive post 18 is slightly protruded from the surface of the ink 21, as shown in FIG. 2(*c*). Then, the board 10 is heat-treated at 400 Celsius degrees for 30 minutes to cure the polyimide. As shown in FIG. 2(*d*), the thinnest thickness of the polyimide 22 is, for example, 8 μm in total.

In this state, the surface of the polyimide 22 has irregularity based on the first wiring pattern. However, if the aforementioned process (the ink is applied and fired so that a top surface of each post is slightly protruded) is conducted, further flatness can be obtained. Alternatively, the polyimide precursor may be applied not to the entire surface, but only to the irregular concave parts and then fired.

Repeating the process several times can flatten the surface of the polyimide 22 such that the irregularities can be almost ignored in the subsequent processes. For applications that the irregularity of the surface is not so important, the flattening process is not required so much as the above.

In the following embodiments, the surface is flatten in the figures for simplicity.

As described above, the interlayer insulation film (polyimide 22) can be formed to assure the exposure of the top surface of each interlayer conductive post 18.

Second Wiring Formation Process

A second wiring pattern 31 is formed on the interlayer insulation film (polyimide 22) by the same process as the first layer. In other words, respective processes including the IPA cleaning, the ultraviolet ray irradiation cleaning, the ink repellency application by alkyl silane fluoride, the control of the contact angle by the ultraviolet ray irradiation, the pattern discharge of the ink containing the silver particulates, and the hot-air drying are performed. Then, the steps of the discharge, the hot-air drying, the discharge and the hot-air drying are repeated as necessary.

For more multilayering, as shown in FIG. 3(*a*), the interlayer conductive post 32 is formed using the similar process as the first layer, and then the board is fired together with the second wiring to be conductive. As shown in FIG. 3(*b*), an interlayer insulation film 33 disposed between the second and third layers is formed using the similar process for forming the interlayer insulation film (polyimide 22) between the first and the second layers. Repeating the process required times can make any number of layers. FIG. 3(*c*) shows the board on which a third layer is formed.

Second Embodiment

Figure 4:
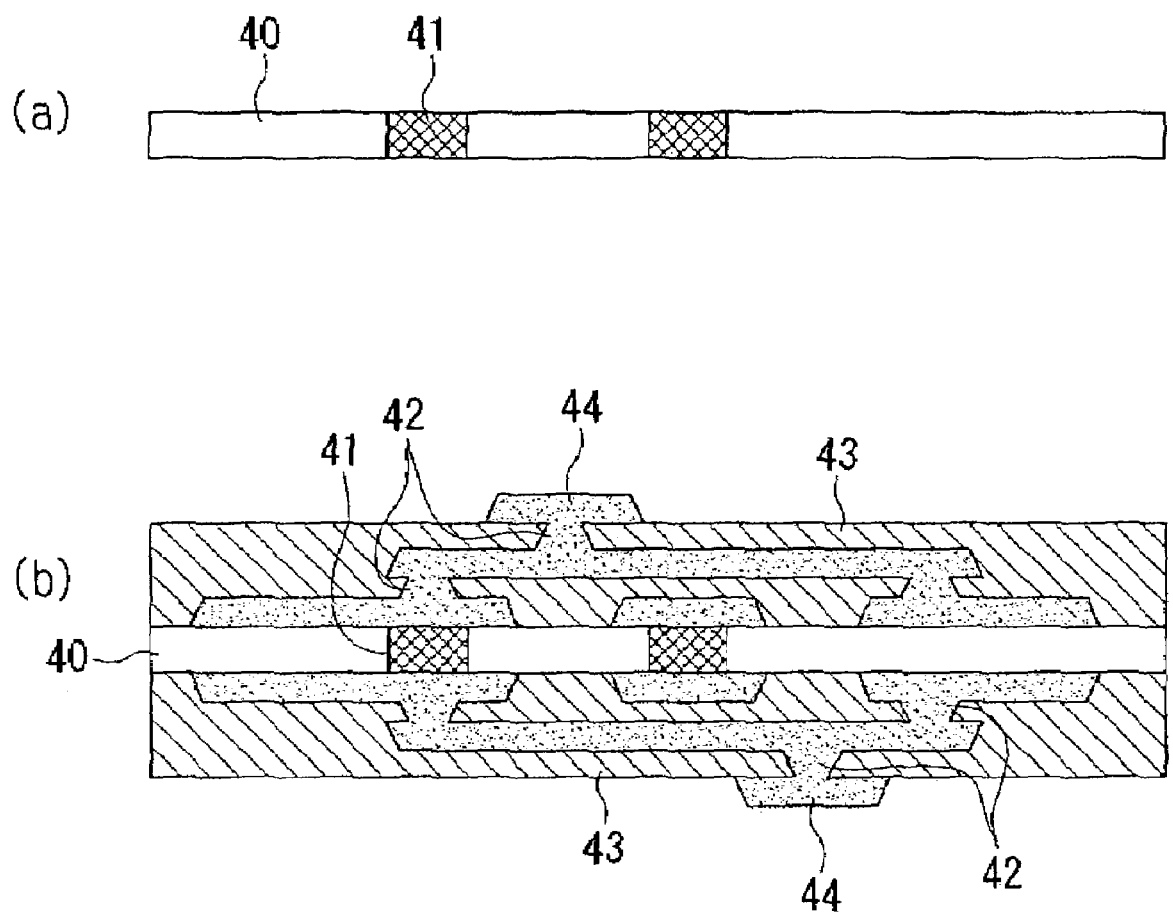
FIG. 4 is a process drawing showing the method of producing the multilayered wiring board according to a second embodiment of the present invention.

FIG. 4 is a process drawing showing the method of producing the multilayered wiring board according to a second embodiment of the present invention. In this embodiment, multilayered printed wiring is formed on both sides of a core board 40.

If the wiring pattern and the insulation film pattern are layered by the liquid drop discharge system similar to the first embodiment, wiring can be produced only on a single side of the board. In order to produce the multilayered printed wiring on both sides of the board, normal double sided wiring board is used as the central core board 40. Starting with such board, similar processes as the first embodiment may be conducted on the both sides.

Preferably, the core substrate 40 may have no through-holes. The through-holes may be filled with a metal paste 41, non-through-holes are perforated to a copper foil of a board having a copper foil side and are filled with the metal paste. Perforation is generally made by photolithography or a laser irradiation. Alternatively, the though-holes or the non-through-holes may be filled with the conductive ink containing the silver particulates used in the first embodiment by the liquid drop discharge system.

Thus, starting with the wiring patterns formed on both surface of the core board 40, repeating the processes of the formation of the interlayer conductor posts 42, the formation of the interlayer insulation film 43 and the formation of wiring patterns 44 on both sides can form the multilayered printed wiring on both side of the core substrate 40.

Third Embodiment

Figure 5:
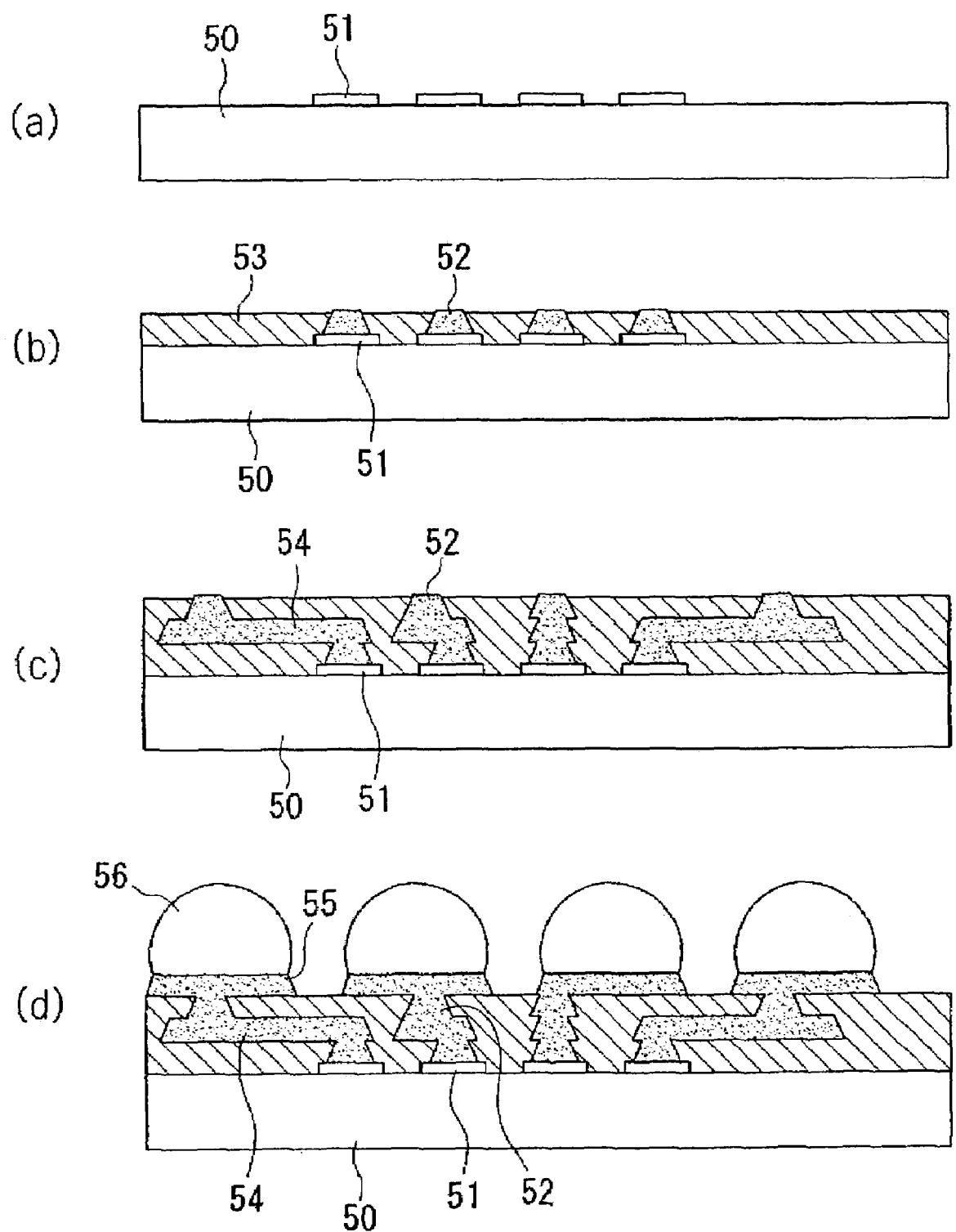
FIG. 5 is a process drawing showing the method of producing the multilayered wiring board according to a third embodiment of the present invention.

FIG. 5 is a process drawing showing the method of producing the multilayered wiring board according to a third embodiment of the present invention. In this embodiment, re-wiring is formed by a Chip Scale Package (CSP) method, i.e., a wiring pattern is drawn directly on a chip to form the multilayered printed wiring.

Firstly, an IC chip 50 on which aluminum pads 51 are formed is subjected to the ink repellent treatment using a monomolecular film as shown in FIG. 5(a). This ink repellent treatment is the same as in the first embodiment except that decyltriethoxysilane is used as a material of the monomolecular film.

Then, as shown in FIG. 5(b), interlayer conductive posts 52 having a height of 5 μm and a diameter of 50 μm are formed in respective centers of the aluminum pads 51 by the similar processes as in the first embodiment. Furthermore, an interlayer insulation film 53 is formed up to the top surfaces of the interlayer conductive posts 52 by the similar processes as in the first embodiment. The interlayer insulation film 53 having a flat top surface can be formed, while exposing the top surfaces of the interlayer conductive posts 52 with certainty.

Then, the processes of the ink repellent treatment, the second wiring layer formation, the interlayer conductive posts formation and the interlayer insulation film formation are conducted, whereby the re-wiring 54 from the aluminum pad 51 is formed as shown in FIG. 5(c). Pads 55 and bumps 56 disposed on the pads 55 are formed on the interlayer conductive posts 52 that are exposed on the surface of the board by normal photolithography, or the wiring formation method in the first embodiment.

Fourth Embodiment

Figure 6:
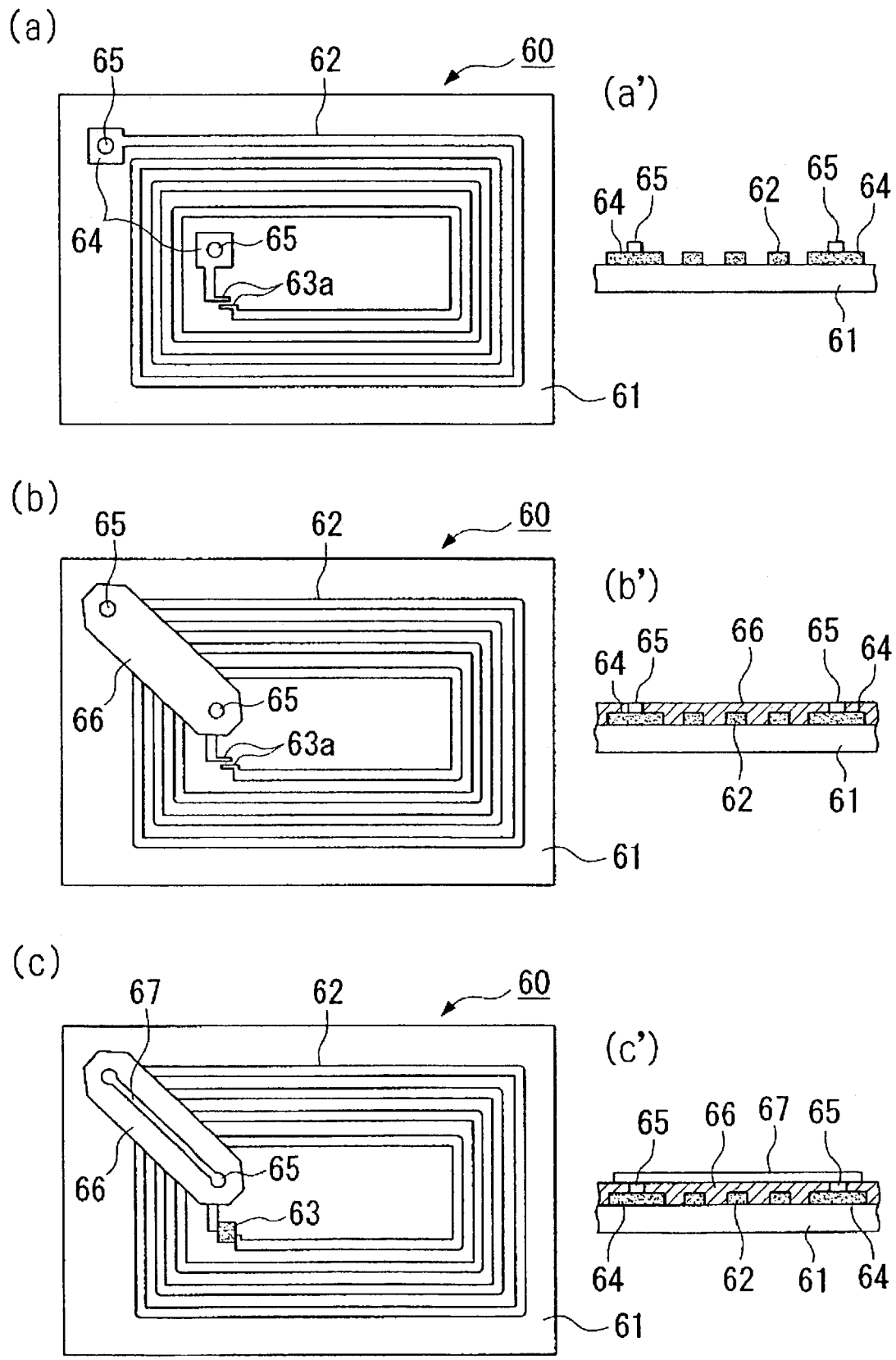
FIG. 6 is a process drawing showing the method of producing the multilayered wiring board according to a fourth embodiment of the present invention.

FIG. 6 is a process drawing showing the method of producing the multilayered wiring board according to a fourth embodiment of the present invention. In this embodiment, a coil shape at an antenna termination of a radio IC card 60 is formed by the production method in the above embodiments. FIGS. 6(a'), (b') and (c') are sectional views between two pads 65 in FIGS. 6(a), (b) and (c).

The radio IC card 60 comprises an IC chip 63 and a coil shaped antenna 62 that are mounted on a polyimide film 61. The IC chip 63 comprises a nonvolatile memory, a logic circuit, a high frequency circuit and the like, and activates by catching at the antenna 62 radio waves transmitted from an external transmitter and receiving electric power supply. The IC chip 63 analyzes an signal received by the antenna 62, and allows the antenna 62 to issue a required signal based on an analyzed result.

In order to produce such a radio IC card, the coil shaped antenna 62 is formed on the polyimide film 61 as shown in FIG. 6(a) in the similar manner for forming the first wiring in the first embodiment. End terminations 63a for mounting pad parts 64 and the IC chip 63 are formed concurrently with the antenna 62. After the antenna 62 is formed, interlayer conductor posts 65 are formed on the pad parts 64 in the similar manner as in the first embodiment. As shown in FIG. 6(b), polyimide is applied in a pattern so that top surfaces of the interlayer conductive posts 65 are exposed, whereby an interlayer insulation film 66 is formed in the similar manner in the first embodiment.

After the interlayer insulation film 66 is formed, an conductive ink containing silver particulates is applied in a pattern shown in FIG. 6(c) by the liquid drop discharge system, and is fired to form wiring 67 for connecting both terminals of the coil shaped antenna 62 in the similar manner in the first embodiment. Finally, the IC chip 63 is mounted on a position shown in FIG. 6(c) using an anisotropic conductive film. A protective film (not shown) is laminated over the whole structure to provide the radio IC card 60.

The radio IC card 60 can, for example, communicate with an external reader/writer 5 cm apart.

When the pad parts 64 is relatively large in a square size of several mm, the multilayered printed wiring can be provided by forming the interlayer conductive posts 65 to leave an area required for conducting the layers, even if the interlayer conductive posts 65 are not formed in advance. In this case, the interlayer insulation films 66 have tapered ends. Therefore, the wiring 67 can be formed on the interlayer insulation layer 66 by the liquid drop discharge system without disconnection.

Electronic Apparatus

Examples of an electronic apparatus comprising the board produced using the method of producing the multilayered wiring board in the above-described embodiments will be described.

Figure 7:
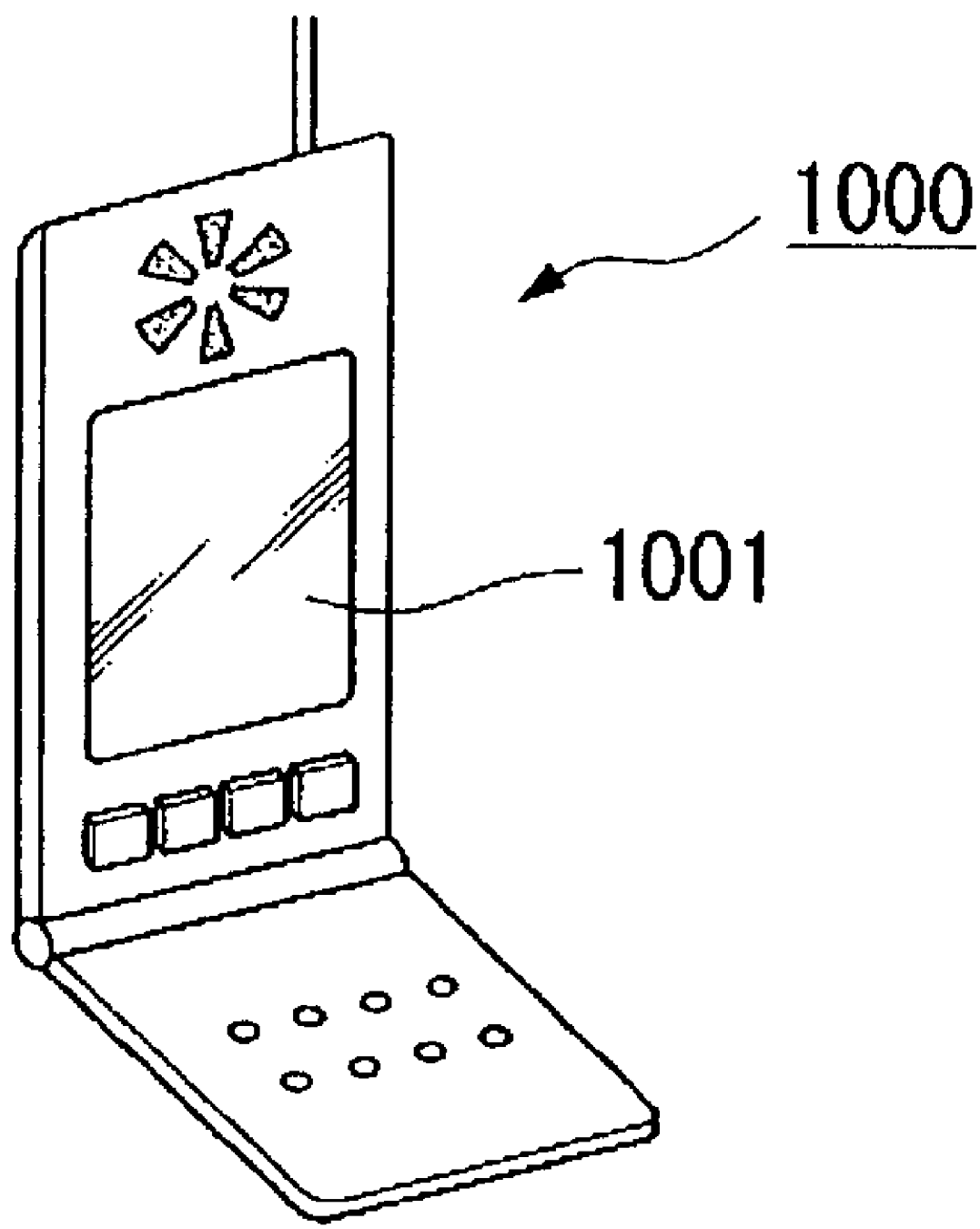
FIG. 7 is a drawing showing an example of an electronic apparatus comprising an electro-optics apparatus according to the embodiment of the present invention.

FIG. 7 is a perspective view showing an example of an mobile phone. In FIG. 7, a numeral 1000 designates a mobile phone body, and a numeral 1001 designates a display using the multilayered wiring board produced by the method in the above-mentioned embodiments.

Figure 8:
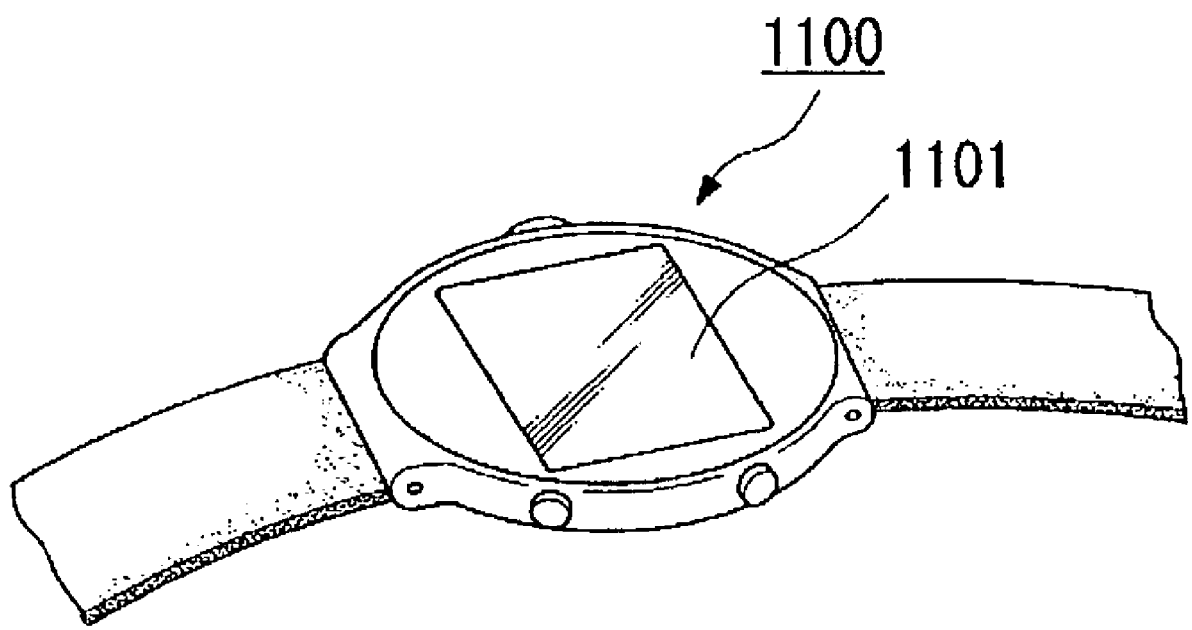
FIG. 8 is a drawing showing an example of an electronic apparatus comprising an electro-optics apparatus according to the embodiment of the present invention.

FIG. 8 is a perspective view showing an example of an electronic watch. In FIG. 8, a numeral 1100 designates a watch body, and a numeral 1101 designates a display using the multilayered wiring board produced by the method in the above-mentioned embodiments.

Figure 9:
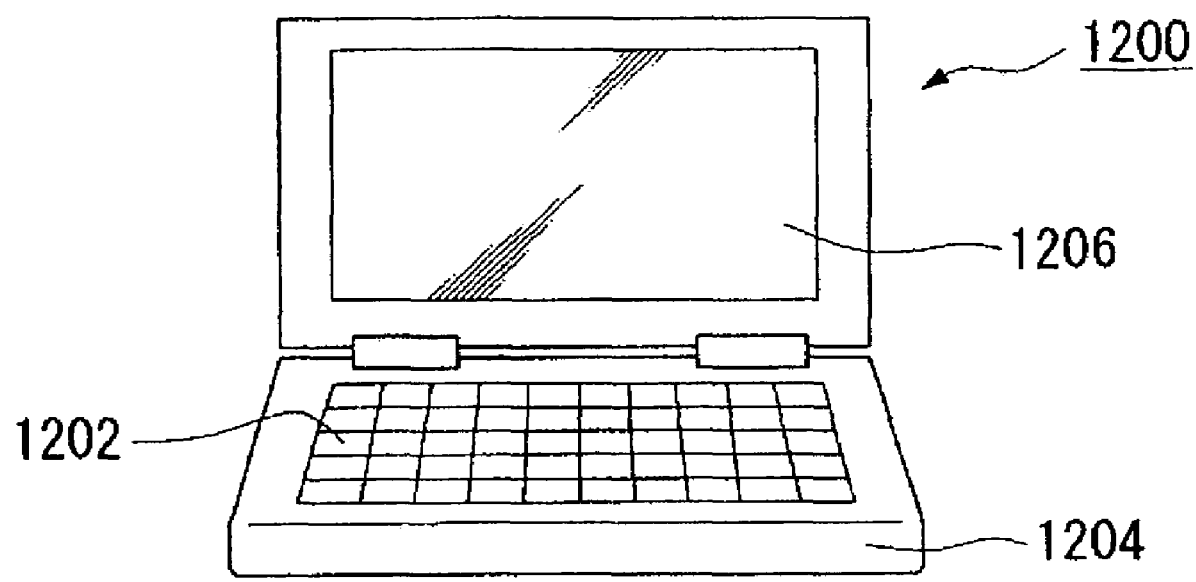
FIG. 9 is a drawing showing an example of an electronic apparatus comprising an electro-optics apparatus according to the embodiment of the present invention.

FIG. 9 is a perspective view showing an example of an mobile information processing apparatus. In FIG. 9, a numeral 1200 designates an information processing apparatus, a numeral 1202 designates an input part such as a keyboard, a numeral 1204 designates an information processing apparatus body, and a numeral 1206 designates a display using the multilayered wiring board produced by the method in the above-mentioned embodiments.

The electronic apparatuses shown in FIGS. 7 to 9 comprise the multilayered wiring board produced by the method in the above-mentioned embodiments, and therefore are produced in simple production processes with a shortened production time than ever.

It should be understood that this invention is not to be unduly limited to the illustrative embodiments set forth herein, and various modifications and alterations of this invention will become apparent without departing from the scope and intent of this invention. Any specific materials, layer structures and production methods set forth in embodiments are only for the purpose of illustration, and can be changed as required.

For example, the production method according to the present invention can be applied to not only the multilayered printed wiring, but also a multilayered wiring for large scale display devices.

As apparent from the above-mentioned description, according to the present invention, the interlayer insulation film is disposed around the conductor posts using the liquid drop discharge system, whereby an elaborate multilayered wiring can be formed with relatively simple production processes.

Japanese patent application No. 2002-113621 filed Apr. 16, 2002 is hereby incorporated by reference.

What is claimed is:

1. A method of manufacturing an electric device, comprising:
    discharging a plurality of first droplets from an inkjet head onto a surface;

drying the plurality of first droplets to form a wiring pattern on the surface;

discharging a plurality of second droplets from the inkjet head onto the wiring pattern without using a mask;

drying the plurality of second droplets to form a second applied film on the wiring pattern;

depositing a plurality of third droplets from the inkjet head onto the second applied film without using a mask;

drying the plurality of third droplets to form a third applied film on the second applied film to form a post pattern on the wiring pattern, the post pattern including the second and the third applied films;

heating the wiring pattern and the post pattern at the same heating process to change the wiring pattern into a conductive wiring and to change the post pattern into a conductive post;

applying a liquid insulating material on the conductive wiring;

heating the liquid insulating material to form an insulating film on the conductive wiring, at least a part of the conductive post protruding from the insulating film; and forming a conductive film on the insulating film, the conductive film insulated from the conductive wiring by the insulating film, the conductive film contacting at least a part of the conductive post.

2. The method of manufacturing an electric device according to claim 1, the liquid insulating material being ejected from an inkjet head.

3. The method of manufacturing an electric device according to claim 1, each of the first, the second, and the third droplets including a plurality of silver particles.

4. The method according to claim 1, further comprising:
irradiating the surface with an ultraviolet ray before discharging the plurality of first droplets onto the surface.

5. The method according to claim 1, further comprising:
forming a monomolecular film on the surface before discharging the plurality of first droplets onto the surface, a contact angle between the monomolecular film and the first droplet being larger than a contact angle between the surface and the first droplet.

6. A method of making an electric device, comprising:
discharging a plurality of first droplets from an inkjet head onto a surface;

drying the plurality of first droplets to form a plurality of first applied films on the surface;

depositing a plurality of second droplets from the inkjet head onto the surface between and on the plurality of first applied films;

drying the plurality of second droplets to form a plurality of second applied films on the surface, the second applied films connecting the first applied films to form a wiring pattern;

depositing a plurality of third droplets from the inkjet head onto the wiring pattern without using a mask;

drying the plurality of third droplets to form a third applied film on the wiring pattern;

depositing a plurality of fourth droplets from the inkjet head onto the third applied film without using a mask;

drying the plurality of fourth droplets to form a fourth applied film on the third applied film to form a post pattern on the wiring pattern, the post pattern including the third and the fourth applied films; and heating the wiring pattern and the post pattern at the same heating process to change the wiring pattern into a conductive wiring and to change the post pattern into a conductive post;

applying a liquid insulating material on the conductive wiring;

heating the liquid insulating material to form an insulating film on the conductive wiring, at least a part of the conductive post protruding from the insulating film; and forming a conductive film on the insulating film, the conductive film being insulated from the conductive wiring by the insulating film, the conductive film contacting at least a part of the conductive post.

* * * * *